United States Patent
Liu et al.

(10) Patent No.: US 10,950,479 B2
(45) Date of Patent: Mar. 16, 2021

(54) METHOD FOR MANUFACTURING LIGHT EMITTING DEVICE

(71) Applicant: Au Optronics Corporation, Hsinchu (TW)

(72) Inventors: Pin-Miao Liu, Hsinchu County (TW); Chen-Chang Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 25 days.

(21) Appl. No.: 16/421,469

(22) Filed: May 24, 2019

(65) Prior Publication Data
US 2019/0378744 A1    Dec. 12, 2019

(30) Foreign Application Priority Data
Jun. 8, 2018 (TW) .................................. 107119904

(51) Int. Cl.
*H01L 21/683* (2006.01)
*H01L 25/075* (2006.01)
(Continued)

(52) U.S. Cl.
CPC ...... *H01L 21/6835* (2013.01); *H01L 25/0753* (2013.01); *H01L 25/167* (2013.01);
(Continued)

(58) Field of Classification Search
CPC ............. H01L 21/6835; H01L 25/0753; H01L 25/167; H01L 27/1214; H01L 33/58; H01L 33/62; H01L 2221/68354; H01L 2221/68368; H01L 2933/0058; H01L 2933/0066; H01L 2224/18;
(Continued)

(56) References Cited

U.S. PATENT DOCUMENTS 9,356,070 B2 * 5/2016 Hsieh ........................ G09G 3/32
10,134,804 B2 11/2018 Hsieh et al.
(Continued)

FOREIGN PATENT DOCUMENTS

CN    106057723    10/2016
TW    201407749    2/2014

*Primary Examiner* — Benjamin Tzu-Hung Liu
(74) *Attorney, Agent, or Firm* — JCIPRNET (57) ABSTRACT

A method of manufacturing a light emitting device is provided. Multiple light-emitting elements are formed on a substrate in a first density. A first transferring process is performed to transfer the light emitting elements to a transition carrier. The light-emitting elements are disposed on the transition carrier in a second density. The first density is greater than the second density. Multiple electronic devices are disposed on the transition carrier in correspondence with the light-emitting elements. An encapsulation layer is formed on the transition carrier to cover the light emitting elements and the electronic devices. Portions of the encapsulation layer are removed to form multiple package units including the light-emitting elements and the electronic devices. A second transferring process is performed to transfer the package units to an array substrate. The encapsulation layer is removed to expose the light emitting elements and the electronic devices. The light emitting elements and the electronic devices are electrically connected to the array substrate.

19 Claims, 9 Drawing Sheets

(51) Int. Cl.
  *H01L 25/16*    (2006.01)
  *H01L 27/12*    (2006.01)
  *H01L 33/58*    (2010.01)
  *H01L 33/62*    (2010.01)

(52) U.S. Cl.
  CPC .......... *H01L 27/1214* (2013.01); *H01L 33/58* (2013.01); *H01L 33/62* (2013.01); *H01L 2221/68354* (2013.01); *H01L 2221/68368* (2013.01); *H01L 2933/0058* (2013.01); *H01L 2933/0066* (2013.01)

(58) Field of Classification Search
  CPC ......... H01L 2224/48091; H01L 27/156; H01L 25/075; H01L 21/561
  See application file for complete search history.

(56) References Cited

U.S. PATENT DOCUMENTS

| | | |
|---|---|---|
| 2005/0233504 A1 | 10/2005 | Doi et al. |
| 2014/0048825 A1 | 2/2014 | Hsieh et al. |
| 2016/0276403 A1 | 9/2016 | Hsieh et al. |
| 2017/0062650 A1 | 3/2017 | Chen et al. |
| 2017/0358624 A1* | 12/2017 | Takeya .................. H01L 25/167 |
| 2019/0051698 A1 | 2/2019 | Hsieh et al. |
| 2019/0123213 A1* | 4/2019 | Yu ....................... H01L 31/0203 |

\* cited by examiner

METHOD FOR MANUFACTURING LIGHT EMITTING DEVICE

CROSS-REFERENCE TO RELATED APPLICATION

This application claims the priority benefit of Taiwan application serial no. 107119904, filed on Jun. 8, 2018. The entirety of the above-mentioned patent application is hereby incorporated by reference herein and made a part of this specification.

BACKGROUND OF THE INVENTION

1. Field of the Invention

The invention relates to a method for manufacturing a light emitting device, and particularly relates to a method for manufacturing a light emitting diode having a side length ranging from several micrometers (μm) to hundreds of micrometers or a light emitting device generally referred to as micro light emitting diode.

2. Description of Related Art

A conventional light emitting diode (LED) chip can be transferred by resorting to the surface-mount technology (SMT) or a die bonder. However, when the structure of the LED becomes thinner and smaller, a manufacturing apparatus for manufacturing micro LEDs needs to be more precise to accurately transfer the micro LEDs. In addition, the accuracy in mass transfer further poses a challenge for the process.

Besides, micro LEDs are commonly integrated with other electronic components in displays when different applications or different requests. However, the sizes, thicknesses, functions, or transfer methods of different electronic components are not quite the same, which makes the techniques of mass production become more difficult. Therefore, how to meet the precision requirement of the process, reduce the manufacturing cost, and increase the yield rate, the machine usage, and the production efficiency in the method for manufacturing a light emitting device having a micro LED has now become an issue to be worked on.

SUMMARY OF THE INVENTION

One or some exemplary embodiments of the invention provides a method for manufacturing a light emitting device able to meet the precision requirement of the process, reduce the manufacturing cost, and increase the yield rate, the machine usage, and the production efficiency.

A method of manufacturing a light emitting device according to an embodiment of the invention at least includes the following. A plurality of light emitting elements are formed on a substrate. The light emitting elements are disposed on the substrate in a first density. A first transfer process is performed to transfer the light emitting elements on the substrate to a transition carrier. The light emitting elements are disposed on the transition carrier in a second density, and the first density is greater than the second density. A plurality of electronic devices are disposed on the transition carrier. The electronic devices are respectively disposed in correspondence with the light emitting elements. A first package layer is formed on the transition carrier to cover the light emitting elements and the electronic devices. Portions of the first package layer are removed to form a plurality of package patterns and thereby form a plurality of package units. Each of the package units includes at least one of the light emitting elements and at least one of the electronic devices. A second transfer process is performed to transfer the package units on the transition carrier to an array substrate. The package patterns of the package units are removed and the light emitting elements and the electronic devices are exposed. A plurality of connection electrodes are formed to respectively electrically connect the respective light emitting elements to some control units on the array substrate and to respectively electrically connect the respective electronic devices to some other control units on the array substrate.

A method of manufacturing a light emitting device according to an embodiment of the invention at least includes the following. A plurality of light emitting elements are provided on a substrate. A first number of the light emitting elements are in a unit area of the substrate. A first transfer process is performed to transfer the light emitting elements on the substrate to a transition carrier. A second number of the light emitting elements are in a unit area of the transition carrier, and the first number is greater than the second number. A first package layer is formed on the transition carrier to cover the light emitting elements. Portions of the first package layer are removed to form a plurality of package units. Each of the package units includes a portion of the light emitting elements. A second transfer process is performed to transfer the package units on the transition carrier to an array substrate. Each of the package units includes a portion of the light emitting elements and is electrically connected with the array substrate. In addition, a transfer device used in the first transfer process is different from a transfer device used in the second transfer process.

A method of manufacturing a light emitting device according to an embodiment of the invention at least includes the following. A plurality of first light emitting elements are formed on a first substrate. A first number of the first light emitting elements are in a unit area of the first substrate. A plurality of second light emitting elements are formed on a second substrate, wherein a second number of the second light emitting elements are in a unit area of the second substrate. A first transfer process is performed to transfer the first light emitting elements on the first substrate to a transition carrier. A third number of the first light emitting elements are in a unit area of the transition carrier, and the first number is greater than the third number. A second transfer process is performed to transfer the second light emitting elements on the second substrate to the transition carrier. The third number of the second light emitting elements are in the unit area of the transition carrier, the second light emitting elements respectively correspond to the first light emitting elements, and the second number is greater than the third number. A first package layer is formed on the transition carrier to cover the first light emitting elements and the second light emitting elements, and the first light emitting elements and the second light emitting elements have different emission spectra. Portions of the first package layer are removed to form a plurality of package units. Each of the package units includes at least one of the first light emitting elements and at least one of the second light emitting elements. A third transfer process is performed to transfer the package units on the transition carrier to an array substrate. In addition, the first light emitting elements and the second light emitting elements of the package units are electrically connected with the array substrate.

Based on the above, in the method for manufacturing the light emitting devices according to the embodiments of the invention, the light emitting elements in a higher density are transferred from the substrate to the transition carrier. Then, the light emitting elements on the transition carrier may form the package units with other electronic devices. Afterwards, the package units in a lower density are transferred from the transition carrier to the array substrate. In this way, the precision requirement is met by using suitable machines in different transfer processes. Besides, the light emitting elements and the electronic devices on the transition carrier are transferred to the array substrate after being integrated in the package units. Therefore, with the manufacturing method, the yield rate, the machine usage, and the production efficiency are increased, and the manufacturing cost is reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is more comprehensively described with reference to the figures of the present embodiments. However, the invention can also be implemented in various different forms, and is not limited to the embodiments described herein. The thicknesses of the layers and regions in the figures are enlarged for clarity. The same or similar reference numerals represent the same or similar components and are not described repetitively in detail in the following paragraphs.

Figure 1A:
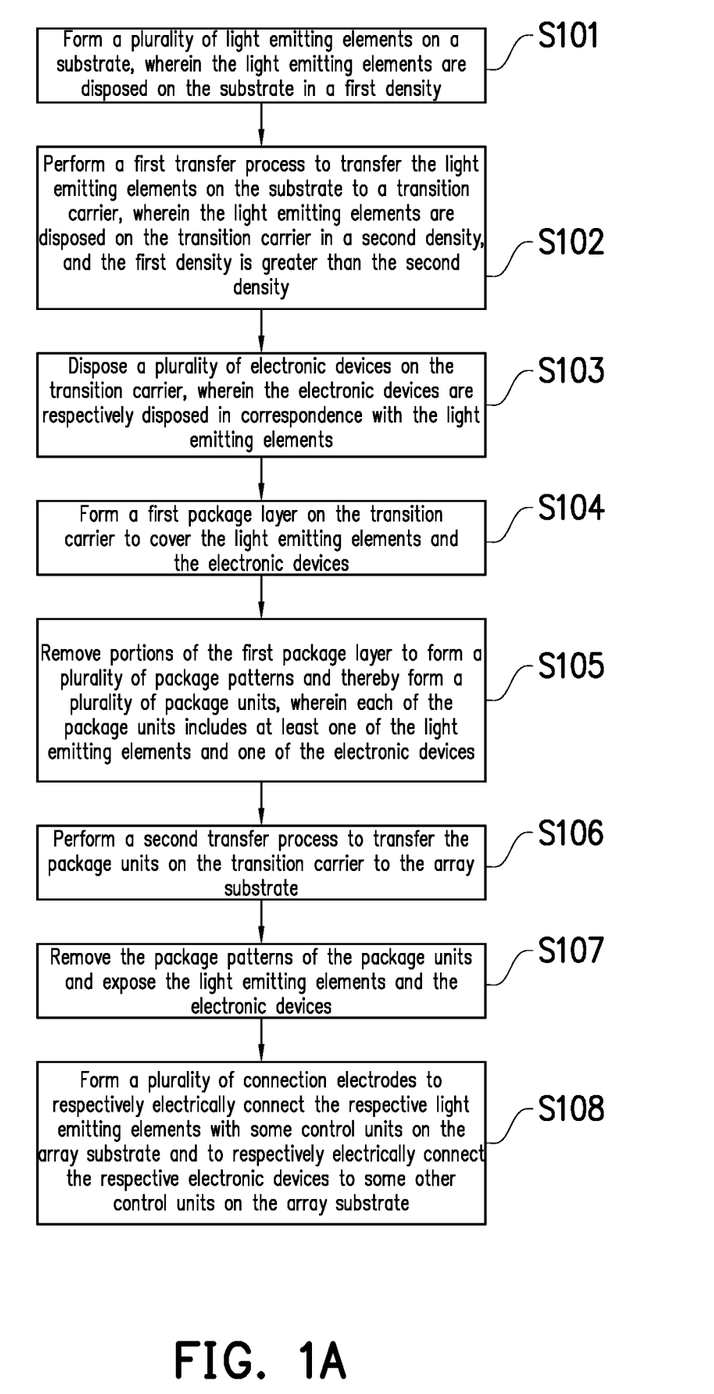
FIG. 1A is a flowchart illustrating a method for manufacturing a light emitting device according to a first embodiment of the invention.

FIG. 1A is a flowchart illustrating a method for manufacturing a light emitting device according to a first embodiment of the invention. FIGS. 1B to 1I are schematic top views illustrating the method for manufacturing a light emitting device according to the first embodiment of the invention. FIG. 1J is a cross-sectional view along the A-A' cross-sectional line in FIG. 1F. FIG. 1K is a cross-sectional view along the B-B' cross-sectional line in FIG. 1I.

Figure 1B:
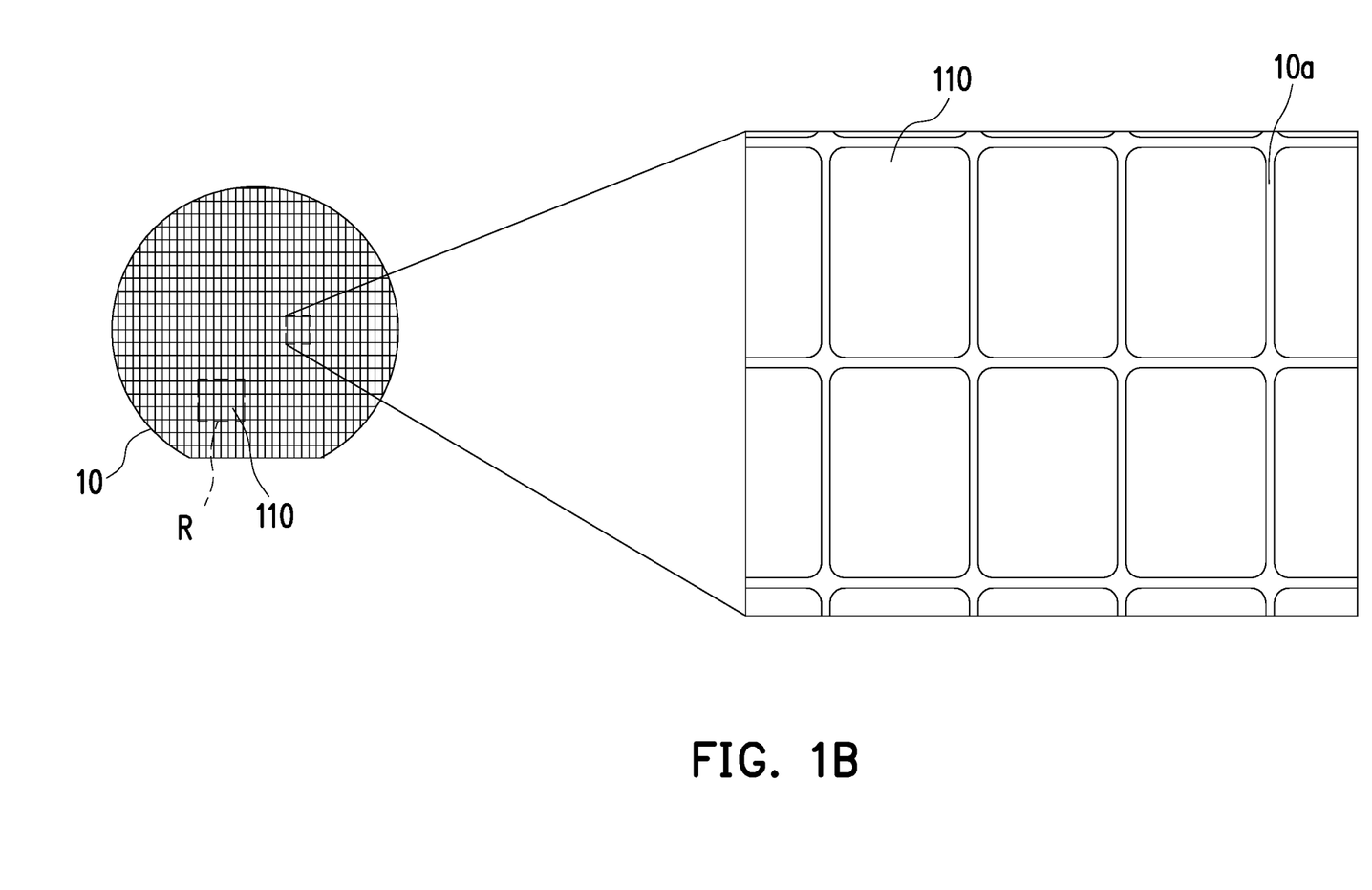
FIGS. 1B to 1I are schematic top views illustrating the method for manufacturing a light emitting device according to the first embodiment of the invention.

Referring to FIGS. 1A and 1B, at Step S101, a plurality of light emitting elements 110 are formed on a substrate 10. The light emitting elements 110 are disposed in a first density on the substrate 10. In the embodiment, the substrate 10 may be a GaAs substrate, a GaP substrate, an InP substrate, a sapphire substrate, an SiC substrate, or a GaN substrate. However, the invention is not limited thereto. In addition, the light emitting element 110 may be a light emitting diode formed through a conventional process for manufacturing a light emitting diode and including a first conductive layer 111 (as shown in FIG. 1J), a first semiconductor layer 112 (as shown in FIG. 1J), a light emitting layer 113 (as shown in FIG. 1J), a second semiconductor layer 114 (as shown in FIG. 1J), and a second conductive layer 115 (as shown in FIG. 1J).

For example, the first semiconductor layer 112, the light emitting layer 113, and the second semiconductor layer 114 may be a doped or undoped InGaN layer and/or GaN layer formed by performing a metal-organic chemical vapor deposition (MOCVD) process, for example, and the first conductive layer 111 and the second conductive layer 115 may be metal or metal oxide layers formed by a physical vapor deposition (PVD) process, for example. Besides, the conventional process for manufacturing a light emitting diode may include a mesa etching process, so as to increase the light extraction efficiency of the light emitting element 110. Besides, an iso-etching process may also be performed to form trenches 10a separating the light emitting elements 110 from each other. It should be noted that the above-mentioned forming processes or materials merely serve as examples, and the invention is not limited thereto. Details concerning the process for manufacturing a light emitting diode will not be reiterated in the embodiments of the invention.

In general, a micro light emitting diode (micro LED or μLED) or a mini LED whose size is greater than or equal to 5 $\mu m^2$ and smaller than or equal to 50 $\mu m^2$ can be formed with the above processes. With such a size, specifically the size greater than or equal to 5 $\mu m^2$ and smaller than or equal to 50 $\mu m^2$ of the micro LED, there may be hundreds of millions micro LEDs on the substrate 10, taking a 6-inch substrate as an example. Therefore, by performing a first transferring process capable of higher-density transfer, a portion of the light emitting elements 110 on the substrate 10 are transferred to a transition carrier 20. Here, size is defined as an area of a vertical projection on the substrate 10. In the case of the micro LED whose size is greater than or equal to 5 $\mu m^2$ and smaller than or equal to 50 $\mu m^2$, the effect of the process is more easily achievable.

In other embodiments, one or more of the light emitting elements 110 on the substrate 10 may be further transferred from the substrate 10 to other transition carriers during the process according to the needs of different processes (e.g., a testing process or a queuing process).

Figure 1C:
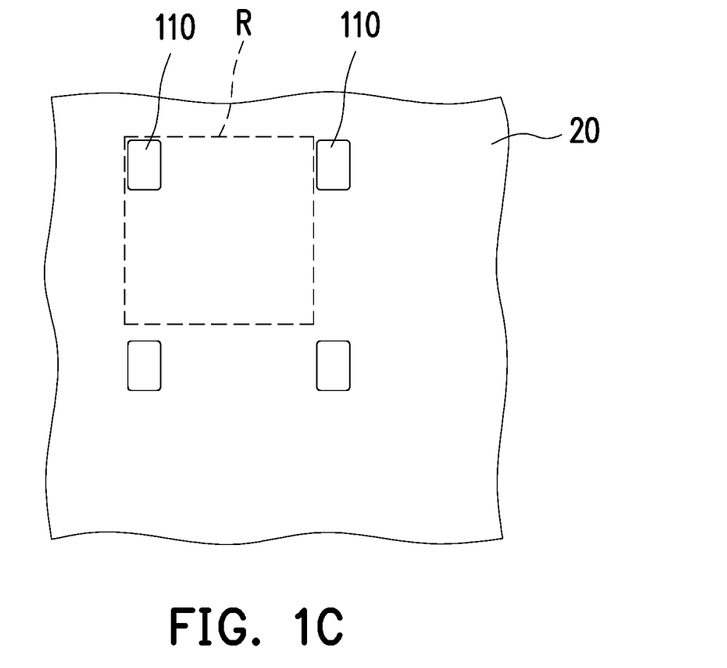

Referring to FIGS. 1A to 1C, at Step S102, the first transferring process is performed to transfer a portion of the light emitting elements 110 on the substrate 10 to the transition carrier 20. The light emitting elements 110 are disposed in a second density on the transition carrier 20, and the first density is greater than the second density. For example, as shown in FIG. 1B, there may be two or more light emitting elements 110 in a unit area R. In addition, as shown in FIG. 1C, there may be one light emitting element 110 in the unit area R of the same size. In other words, compared with the number of the light emitting elements 110 in the unit area R on the transition carrier 20 (i.e., the second density), the number of the light emitting elements 110 in the unit area R on the substrate 10 (i.e., the first density) is two-fold or more.

The first transfer process may include transferring a portion of the light emitting elements 110 on the substrate 10 to the transition carrier 20 through imprinting, electrostatic, wafer transfer and/or other suitable methods by using a machine having a polydimethylsiloxane (PDMS) mold, a machine capable of generating and removing static electricity, a machine having a wafer-to-wafer alignment and bonding device, and/or other suitable higher-density transfer machines.

Figure 1D:
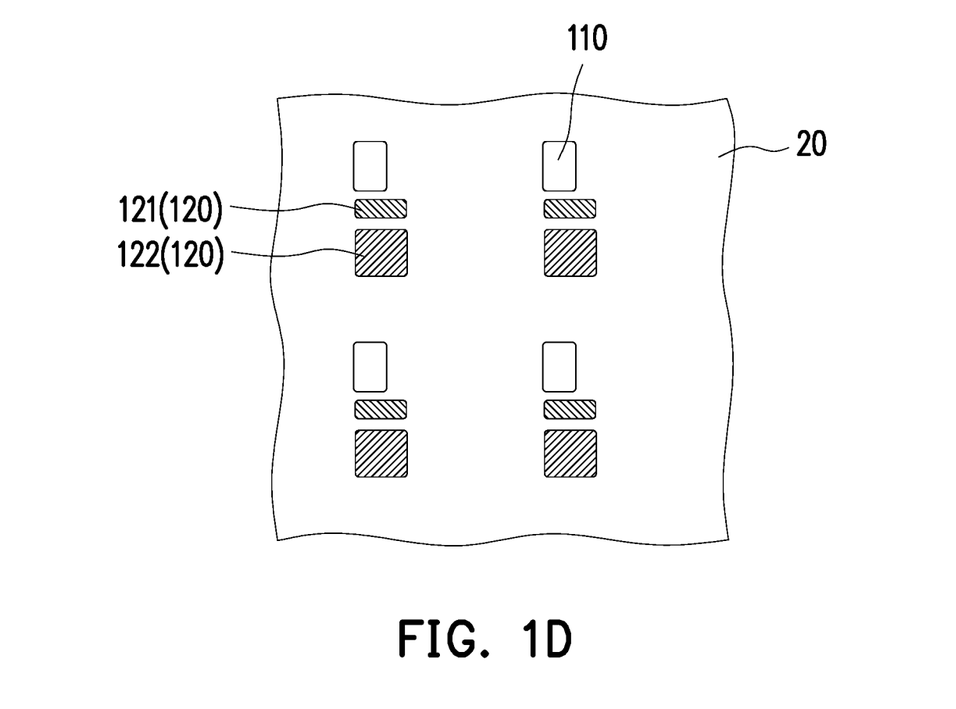

Referring to FIGS. 1A and 1D, at Step S103, a plurality of electronic devices 120 are transferred to the transition carrier 20. The electronic device 120 are respectively disposed in correspondence with the light emitting elements 110. The types of the electronic devices 120 may include lighting elements, touch elements, sensing elements, driving elements, energy storage elements, energy conversion elements, and/or other suitable electronic devices.

For example, the lighting element may be a different type of light emitting element, and the emission spectrum of the different type of light emitting element is different from the emission spectrum of the light emitting element 110. Based on the sensing method, the touch element may include a resistive touch element, a capacitive touch element, an optical touch element, an acoustic-wave touch element, or an electromagnetic touch element. Based on the working principle, the sensing element may include a resistive sensing element, a capacitive sensing element, an inductive sensing element, a piezoelectric sensing element, a thermoelectric sensing element, an impedance sensing element, a magnetic sensing element, an optoelectronic sensing element, a resonating sensing element, a Hall sensing element, an ultrasonic sensing element, an isotope sensing element, an electrochemical sensing element, or a microwave sensing element. Alternatively, based on the sensing technology, the sensing element may include an ultrasonic sensing element, a temperature sensing element, a humidity sensing element, a gas sensing element, a pressure sensing element, an acceleration sensing element, an ultraviolet sensing element, a magnetosensitive sensing element, a magnetoresistive sensing element, an image sensing element, an electricity sensing element, or a movement sensing element. Alternatively, based on the types of application, the sensing element may include a pressure sensing element, a temperature/humidity sensing element, a temperature sensing element, a pH sensing element, a flow sensing element, a liquid level sensing element, an ultrasonic sensing element, an immersion sensing element, an illumination sensing element, a difference pressure transmitter, an acceleration sensing element, a movement sensing element, a weighing sensing element, or a distance sensing element. The driving element includes a circuit device for driving a load, such as a microelectromechanical system (MEMS) or a nanoelectromechanical system (NEMS) for driving a micromechanical device, or such as an active component for driving a current, such as an integrated circuit or other control circuits formed through a semiconductor manufacturing process. The energy storage element includes, for example, a capacitor capable of storing electrical potential energy, a battery capable of storing chemical energy, an inductor capable of storing magnetic potential energy, and a piezoelectric device capable of storing a mechanical potential energy. The energy conversion element is, for example, a device capable of converting optical energy, electrical potential energy, chemical energy, magnetic potential energy, mechanical potential energy, and thermal energy, etc., between/among each other (e.g., a capacitor, an inductor, a resistor, a battery, or the like). In brief, the electronic device 120 is generally related to current/electron flow.

In the embodiment, the number of the electronic devices 120 may be an integer multiple of the number of the light emitting elements 110 on the transition carrier 20. Alternatively, the proportion therebetween may be lower based on the needs of use. Nevertheless, the invention does not intend to impose a limitation on this regard.

In the embodiment, the electronic devices 120 may include first electronic devices 121 and second electronic devices 122. For example, through matching according to the needs of use, the first electronic device 121 and the second electronic device 122 may have the same function but different side lengths/sizes/volumes, or the first electronic device 121 and the second electronic device may have the same side length/size/volume but different functions, or the first electronic device 121 and the second electronic device 122 may have the same side length/size/volume and function, or the first electronic device 121 and the second electronic device 122 may have different side lengths/sizes/volumes and functions.

The first electronic devices 121 and the second electronic devices 122 are respectively disposed in correspondence with the light emitting elements 110. In the embodiment, the numbers of the first electronic devices 121 and the second electronic devices 122 may be an integer multiple of the number of the light emitting elements 110 on the transition carrier 20, or the proportion therebetween may be higher or lower based on the needs of use. The number of the first electronic devices 121 and the number of the second electronic devices 122 may also be different from each other. Still, the invention does not intend to impose a limitation on this regard. In some modified embodiments, the electronic devices 120 may be devices of the same type with the type of the light emitting elements 110. For example, both of the electronic devices 120 and the light emitting elements 110 are light emitting diodes, but the light emitting elements 110 and the light emitting diodes of the electronic devices 120 have different emission spectra, and the light emitting elements 110 and the electronic devices 120 are transferred from different substrates.

In the embodiment, there is no specific limitation on the position relationship among the light emitting elements 110, the first electronic devices 121, and the second electronic devices 122. For example, the first electronic devices 121 and the second electronic devices 122 may be vertically stacked or horizontally disposed with an interval.

The material of the transition carrier 20 may include glass, quartz, organic polymer, metal, wafer, ceramic, or other suitable materials. In the embodiment, a support material layer (not shown) may be provided on the transition carrier 20, and the light emitting elements 110 and the electronic devices 120 are located on the support material layer. The support material layer may be patterned in a subsequent process to form a temporary fixing structure 130 (shown in FIG. 1J). The temporary fixing structure 130 may connect the light emitting element 110 and the electronic device 120 to the transition carrier 20. In other embodiments, a release layer may be provided on the transition carrier 20, and the light emitting elements 110 and the electronic devices 120 are located on the release layer. The release layer includes, for example, a light-to-heat conversion (LTHC) release material or other suitable materials, so as to increase the releasability between the light emitting elements 110/electronic devices 120 and the transition carrier 20 in a subsequent process.

Figure 1E:
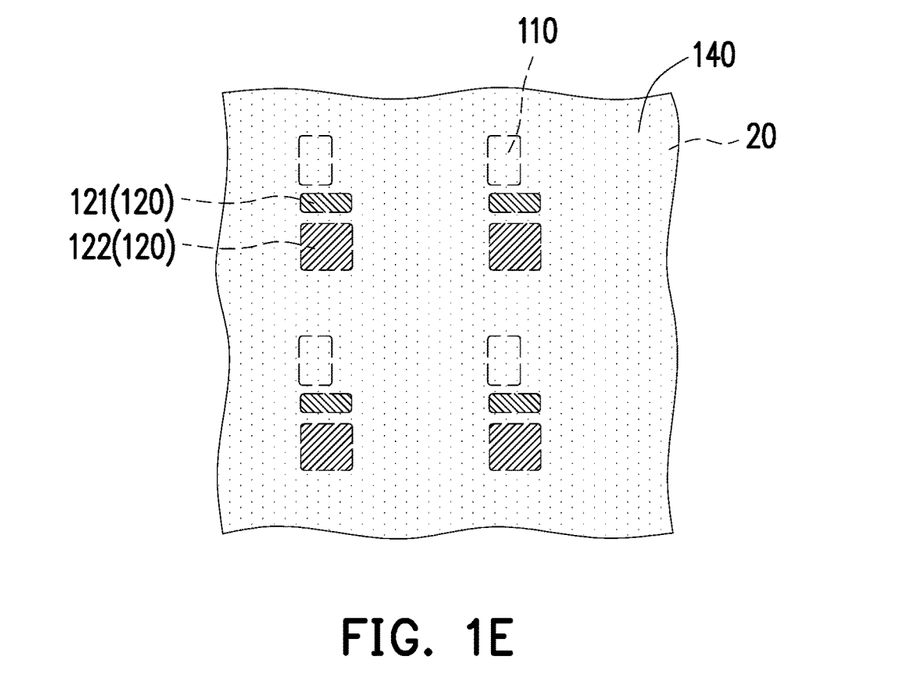

Referring to FIGS. 1A and 1E, at Step S104, a first package layer 140 is formed on the transition carrier 20 to cover the light emitting elements 110 and the electronic devices 120.

In some embodiments, the first package layer 140 may include a photo resist or other moldable and removable polymer gel material (e.g., resin or silica), and the fluid polymer gel material is coated onto the transition carrier 20 by performing, for example, a molding process, a coating process, a printing process, or other suitable processes. Then, through irradiating, heating, statically placing, or other suitable processes, the polymer gel material is cured. In some embodiments, the first package layer 140 may be a curable photoresist layer. In the embodiment, the first package layer 140 encapsulates the light emitting elements 110 and the electronic devices 120 on the transition carrier 20. The light emitting devices 110 and the electronic devices 120 can be fixed and protected by the first package layer 140 covering the transition carrier 20.

Figure 1F:
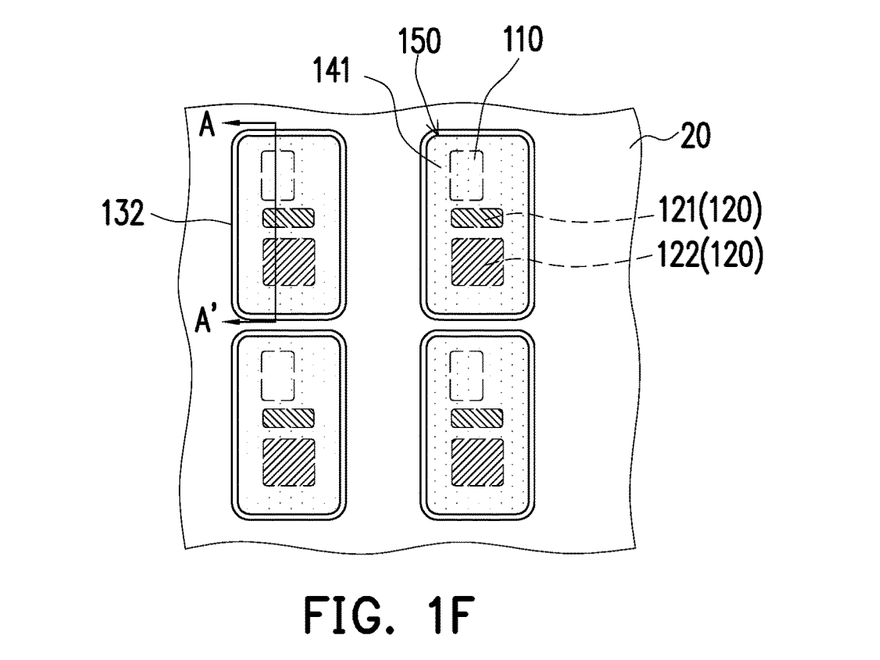
Figure 1G:
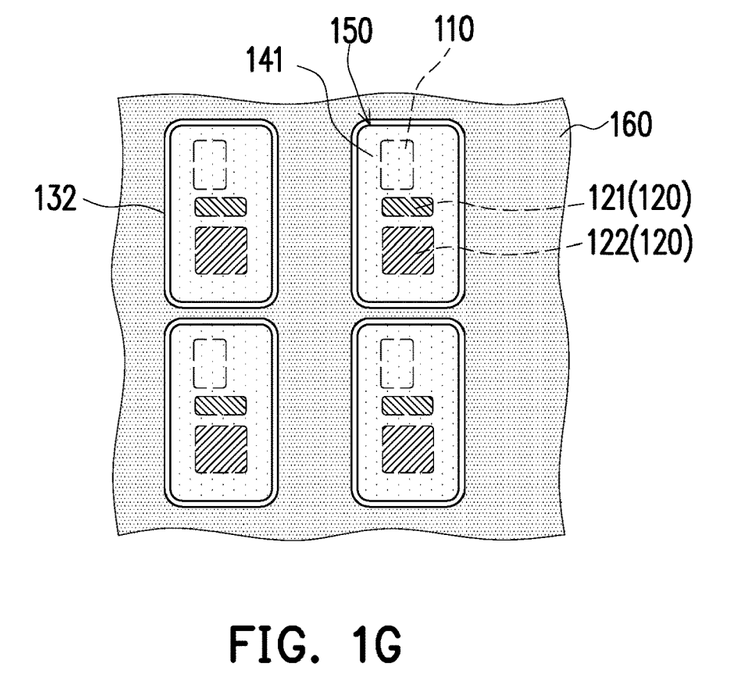
Figure 1H:
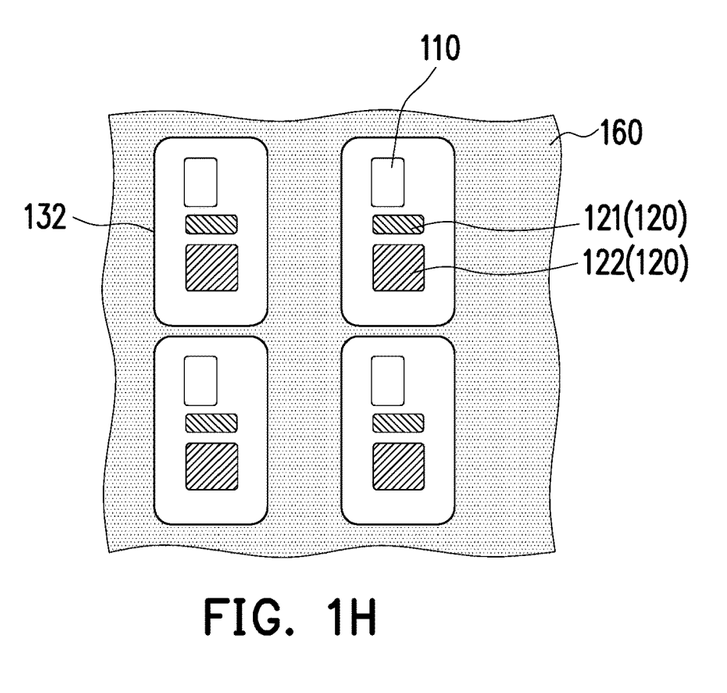
Figure 1I:
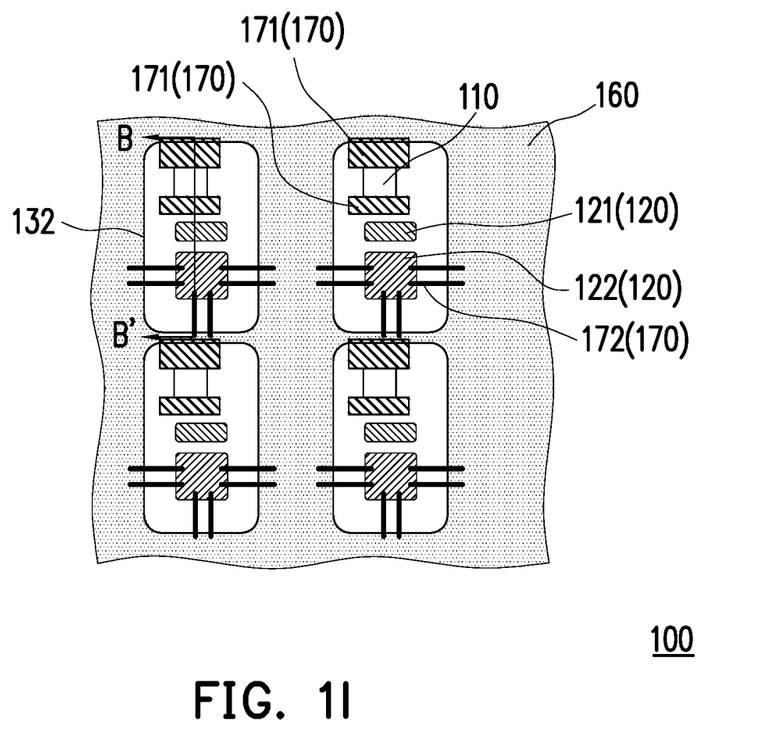
Figure 1J:
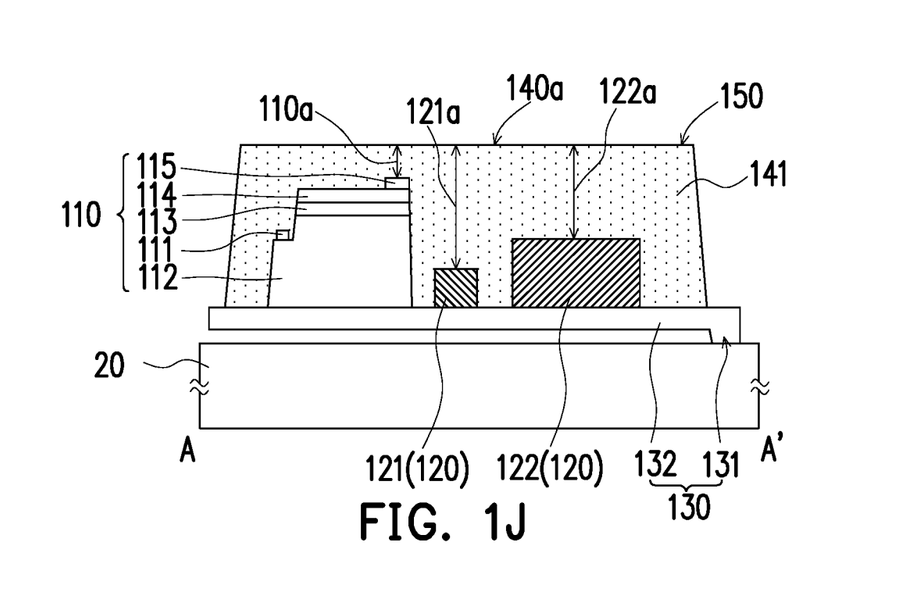
FIG. 1J is a cross-sectional view along the A-A' cross-sectional line in FIG. 1F.
Figure 1K:
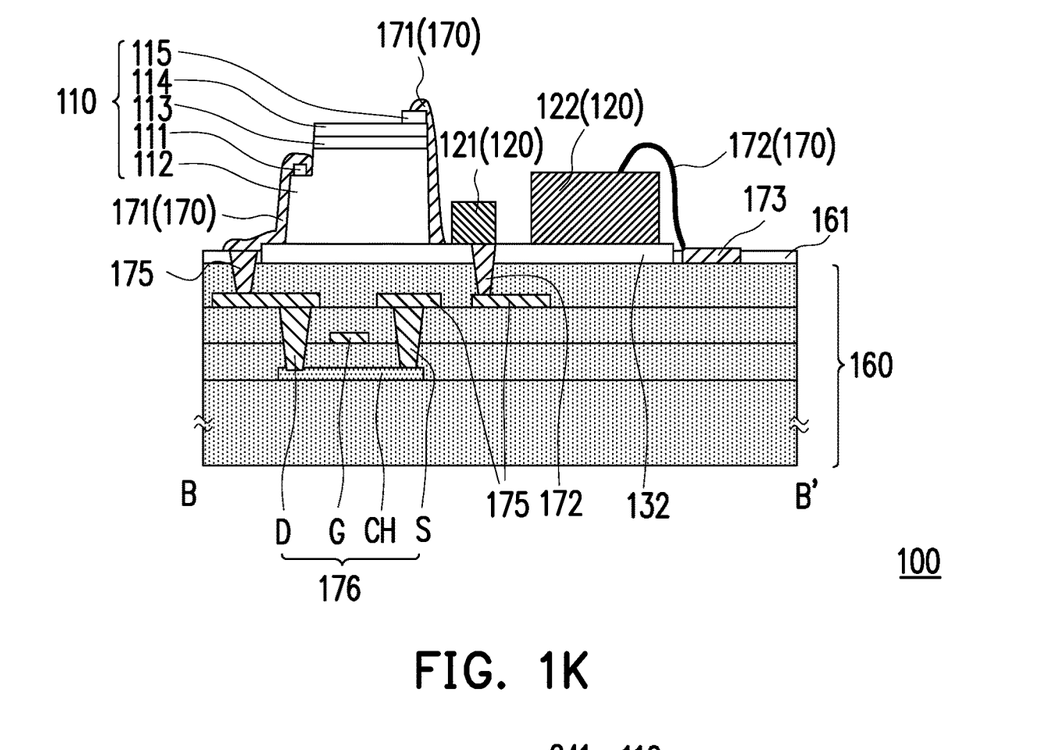
FIG. 1K is a cross-sectional view along the B-B' cross-sectional line in FIG. 1I.

Referring to FIGS. 1A, 1F and 1J, at Step S105, a portion of the first package layer 140 is removed (as shown in FIG. 1E), so as to form a plurality of package patterns 141 and thereby form a plurality of package units 150. As an example, each of the package units 150 includes at least one light emitting element 110 and at least one electronic device 120. In the embodiment, an exposure process, a development process, an etching process, or an ashing process, for example, may be performed to remove portions of the first package layer 140 between two adjacent light emitting elements 110, so that each of the package units 150 includes one light emitting element 110, one first electronic device 121, and one second electronic device 122. However, the invention is not limited thereto.

As shown in FIG. 1J, a minimum distance 110a between a top surface 140a of the package pattern 141 and the light emitting element 110 and a minimum distance 121a between the first electronic device 121 and the second electronic device 122 are greater than or equal to 0.2 μm. In this way, even if the light emitting element 110 and the electronic device 120 have different thicknesses, the first package layer 140 formed through coating may still have the relatively flat top surface 140a that is more suitable for a subsequent second transfer process.

In general, with the process above, the package unit 150 with a size greater than or equal to 50 μm$^2$ and smaller than or equal to one million μm$^2$ can be formed. Besides, compared with the height difference caused by the thickness of the light emitting element 110 and the thickness of the electronic device 120, the top surface 140a of the package unit 150 is flatter. Therefore, by performing the second transfer process, which is a conventional lower-density transfer process, the package units 150 on the transition carrier 20 are transferred to the array substrate 160.

In some modified embodiments, when the electronic device 120 and the light emitting element 110 are light emitting diodes with different emission spectra, the light emitting diodes of different colors can be simultaneously transferred to the array substrate 160 through the second transfer process. In this way, the offset and the color shift of the light emitting diodes in different colors caused by the difference in precision among different transfer processes are also reduced.

In other embodiments, one or more of the package units 150 on the transition carrier 20 may be further transferred from the transition carrier 20 to other transition carriers during the process according to the needs of different processes (e.g., a testing process or a queuing process).

In the embodiment, if the light emitting elements 110 and the electronic devices 120 are located on the support material layer of the transition carrier 20, an etching process may be performed to pattern the support material layer and form the temporary fixing structures 130. The temporary fixing structures 130 correspond to the package units 150. In addition, the temporary fixing structure 130 includes a mesa 132 and a tether 131, so that the package unit 150 on the mesa 132 is connected to the transition carrier 20 via the tether 131.

Referring to FIGS. 1A and 1G, at Step S106, the second transfer process is performed to transfer the package units 150 on the transition carrier 20 to the array substrate 160.

For example, the second transfer process may include transferring a portion of the package units 150 on the transition carrier 20 to the array substrate 160 by using a machine having a vacuum suction nozzle device, a machine having a pick-and-place device, a machine capable of generating and removing static electricity, a machine having an electromagnetic generation device, and/or other suitable lower-density transfer devices through vacuum suction, mechanical picking and placing, electrostatic suction, magnetic suction, and/or other suitable processes.

Of course, the methods or devices used in the first transfer process and the second transfer process may be the same or different. However, if different and more suitable transfer devices are used in the first transfer process and the second transfer process according to the sizes or densities of the light emitting elements 110, the electronic devices 120 and the package units 150, the first transfer process and the second transfer process can become more efficient, and the activation rate of the machine can thereby become higher.

In the embodiment, since the package unit 150 on the mesa 132 of the temporary fixing structure 130 is connected to the transition carrier 20 through the tether 131 of the temporary fixing structure 130, the tether 131 of the temporary fixing structure 130 may be broken by a force applied in the second transfer process, so that the mesa 132 and the package unit 150 on the mesa 132 are separated from the transition carrier 20. In some embodiments, the mesa 132 below each of the light emitting elements 110 and the electronic devices 120 may also be a discontinuous surface or a plurality of surfaces whose areas are smaller than the area of the light emitting element 110 and the electronic device 120. In other embodiments, if a release layer is provided on the transition carrier 20, and the package units 150 are connected to the transition carrier 20 through the release layer, the package units 150 may also be separated from the transition carrier 20 by reducing the adhesive force of the release layer through light or heat application. Since there are various ways to release the package units 150, the temporary fixing structures 130 are not shown in some embodiments and drawings.

Referring to FIGS. 1A and 1H, at Step S107, the package patterns 141 of the package units 150 are removed, and the light emitting elements 110 and the electronic devices 120 are exposed. In the embodiment, an etching process, an ashing process, or a rinsing process using a chemical solution, for example, may be performed to remove the package patterns 141 of the package units 150 on the array substrate 160. However, the invention is not limited thereto.

In the embodiment, an adhesive layer 161 may be provided on the array substrate 160, so as to fix the light emitting elements 110 and the electronic devices 120 to the array substrate 160.

Referring to FIGS. 1A, 1I and 1K, at Step S108, a plurality of connection electrodes 170 are formed to respectively electrically connect the respective light emitting elements 110 and some control units on the array substrate 160 and to respectively electrically connect the respective electronic devices 120 and some other control units on the array substrate 160, or to respectively electrically connect the respective light emitting elements 110 and electronic devices 120. In addition, the connection electrodes 170 may be formed by performing a patterning photomask process of the same layer or different patterning photomask processes of different layers. For example, by performing a photolithographic process and an etching process, a conductive via 175 penetrating through the mesa 132 and/or the adhesive layer 161 is formed. Alternatively, by performing a deposition process or a screen printing process, a conductive layer 171 on the device (e.g., the light emitting element 110) is formed.

Referring to FIGS. 1A, 1I and 1K, at Step S108, a plurality of connection electrodes 170 are formed to respectively electrically connect the respective light emitting elements 110 and some control units on the array substrate 160 and to respectively electrically connect the respective electronic devices 120 and some other control units on the array substrate 160, or to respectively electrically connect the respective light emitting elements 110 and electronic devices 120. In addition, the connection electrodes 170 may be formed by performing a patterning photomask process of the same layer or different patterning photomask processes of different layers. For example, by performing a photolithographic process and an etching process, a conductive via 175 penetrating through the mesa 132 and/or the adhesive layer 161 is formed. Alternatively, by performing a deposition process or a screen printing process, a conductive layer 171 on the device (e.g., the light emitting element 110) is formed. Alternatively, by performing a wire bonding process, a conductive wire 172 connected to the device (e.g., the second electronic device 122) is formed. The control unit connected to the light emitting device 110 or the control unit connected to the electronic device 120 includes an active device 176, for example. The active device 176 includes a source S, a drain D, a gate G, and a channel layer CH, and serves to drive the corresponding light emitting element 110 or electronic device 120.

In the embodiment, the connection electrode 170 may be, for example, the conductive layer 171 or the conductive wire 172 covering the device, so that the light emitting element 110 or the electronic device 120 is electrically connected to the control unit of the array substrate 160 through the conductive via 175, a solder pad 1731 and/or an inner conductive wire 174.

It should be noted that, for the conciseness of illustration, an insulating layer between the conductive layer 171 and the light emitting element 110 (the first semiconductor layer 112, the light emitting layer 113, and the second semiconductor layer 114) is omitted in FIG. 1K.

After the above processes, a light emitting device 100 of the embodiment is substantially completed. It should be noted that, in FIGS. 1I and 1K, the position relationship between the light emitting elements 110 and the electronic devices 120 may be adjusted based on the needs of circuit design, and the invention does not intend to impose a limitation on this regard.

Figure 2:
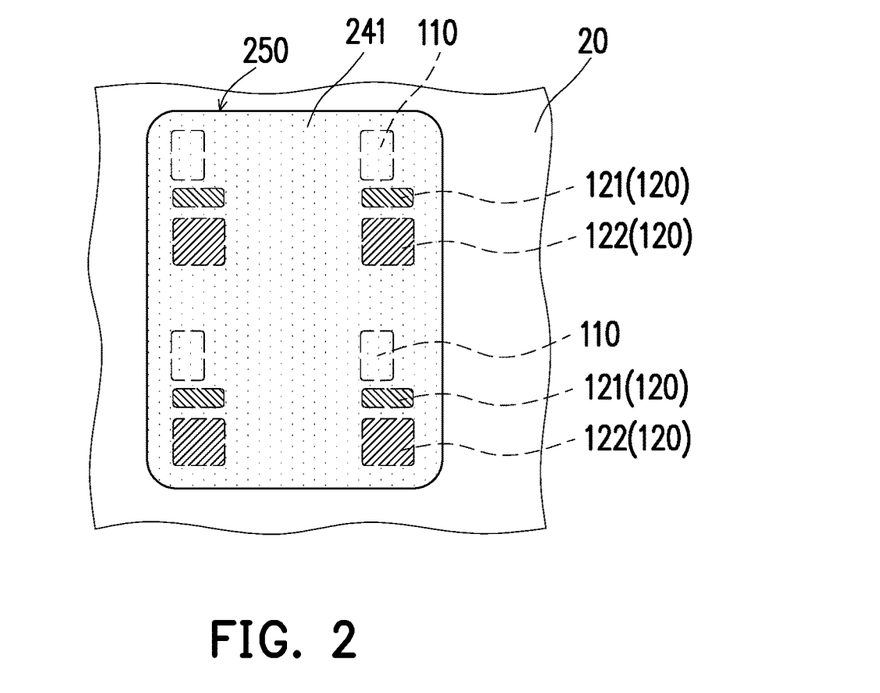
FIG. 2 is a schematic top view illustrating a method for manufacturing a portion of a light emitting device according to a second embodiment of the invention.

FIG. 2 is a schematic top view illustrating a method for manufacturing a portion of a light emitting device according to a second embodiment of the invention. The method for manufacturing the light emitting device 100 of the embodiment is similar to the method for manufacturing the light emitting device of the first embodiment. In addition, similar components are referred to with the same symbols and have similar functions, materials, or forming methods. Also, relevant descriptions will be omitted in the following. Specifically, FIG. 2 is a partial schematic top view illustrating the method for manufacturing the light emitting device after Step S104 in FIG. 1A and FIG. 1E.

Following Step S104 in FIG. 1A and FIG. 1E, in FIG. 2, portions of the first package layer 140 (shown in FIG. 1E) are removed in the embodiment, so as to form a plurality of package patterns 241 and thereby form a plurality of package units 250. The package units 250 include the light emitting elements 110 and the electronic devices 120. The proportion and matching of the numbers of the light emitting elements 110 and the electronic devices 120 in each of the package units 250 may be adjusted based on the needs of use. It should be noted that, while only one package unit 250 is shown in FIG. 2, other identical or similar package units 250 are also provided on the transition carrier 20 in other portions not shown in FIG. 2.

The subsequent manufacturing processes are substantially the same as or similar to Steps S106 to S108 in FIG. 1A and FIGS. 1G to 1I. Therefore, details in this regard will not be repeated in the following.

Figure 3A:
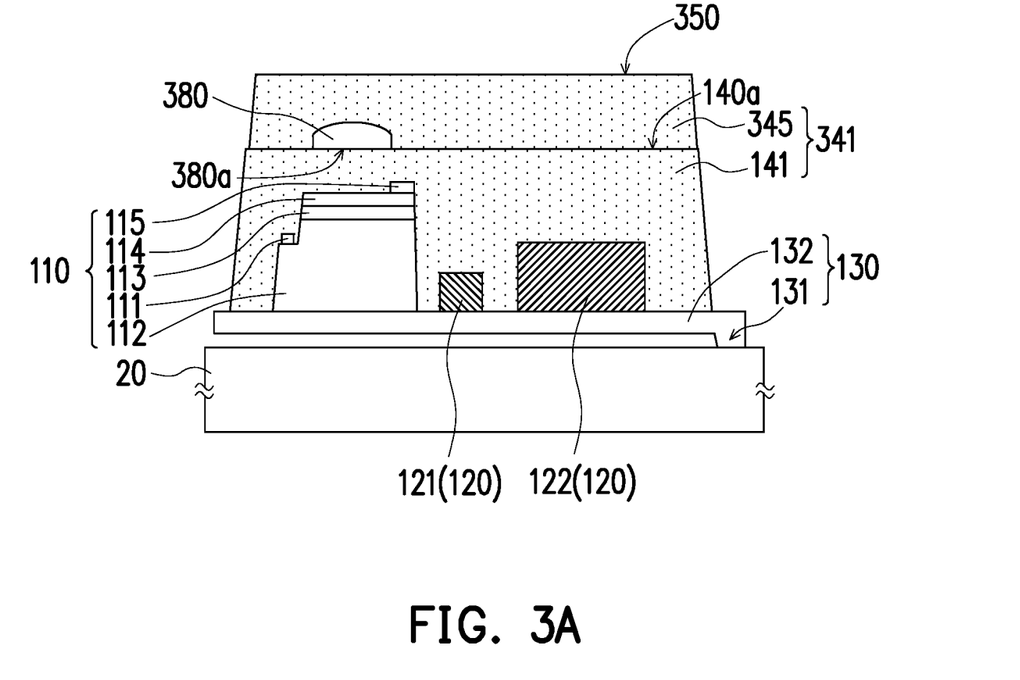
FIGS. 3A to 3B are schematic cross-sectional views illustrating a method for manufacturing a portion of a light emitting device according to a third embodiment of the invention.
Figure 3B:
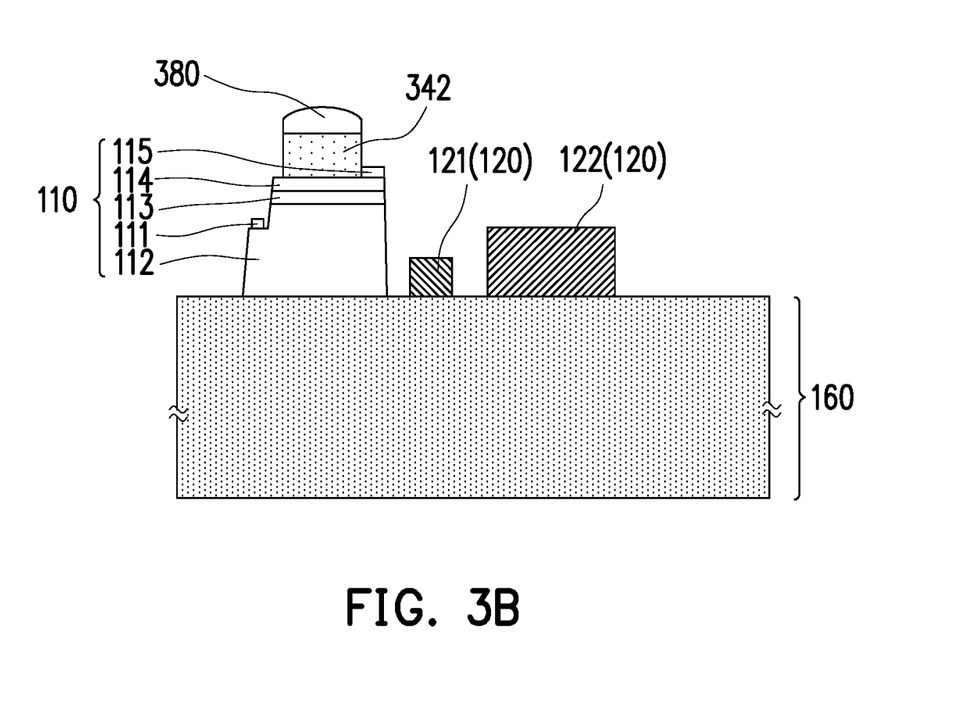

FIGS. 3A to 3B are schematic cross-sectional views illustrating a method for manufacturing a portion of a light emitting device according to a third embodiment of the invention. The method for manufacturing the light emitting device of the embodiment is similar to the method for manufacturing the light emitting device of the first embodiment. In addition, similar components are referred to with the same symbols and have similar functions, materials, or forming methods, and relevant descriptions will be omitted in the following. Specifically, FIGS. 3A and 3B are partial schematic top views illustrating the method for manufacturing the light emitting device after Step S104 in FIG. 1A and FIG. 1E.

Following Step S104 in FIG. 1A and FIG. 1E, in FIG. 3A, after the first package layer 140 (shown in FIG. 1E) is formed on the transition carrier 20 to cover the light emitting elements 110 and the electronic devices 120, a plurality of light guide elements 380 are formed on the top surface 140*a* of the first package layer 140 in the embodiment.

In the embodiment, the light guide elements 380 may be formed on the first package layer 140, and then portions of the first package layer 140 are removed to form the package patterns 141. However, the invention is not limited thereto. In other embodiments, the light guide elements 380 may be formed on the top surface 140*a* of the package patterns 141 after the portions of the first package layer 140 are removed to form the package patterns 141.

In the embodiment, bottom surfaces 380*a* of the light guide elements 380 are in contact with the top surfaces 140*a* of the package patterns 141. In addition, the light guide elements 380 are disposed in correspondence with the light emitting elements 110.

The material of the first package layer 140 has a low absorption coefficient and a high transmittance, and may serve as a buffer between the light guide element 380 and the light emitting element 110, so as to reduce the damage to the light emitting element 110 caused by the light guide element 380.

The material of the light guide element 380 includes, for example, glass, quartz, silica, polymethylmethacrylate, polycarbonate, or any other suitable materials having a low absorption coefficient and a high transmittance. In addition, the material of the light guide element 380 is different from the material of the first package layer 140.

In the embodiment, the light guide element 380 is a convex lens. However, the invention is not limited thereto. In other embodiments, the light guide element 380 may be a concave lens. In some embodiments, the light guide element 380 may be a lens set including one or more convex lenses and/or concave lenses.

After the light guide elements 380 are formed, a second package layer 345 may be formed on the carrier plate 20 to cover the light guide elements 380 and the first package layer 140. The material and the formation method of the second package layer 345 may be similar to those of the first package layer 140. Therefore, details in this regard will not be repeated in the following.

Then, steps similar to FIGS. 1F and 1J and Step S105 may be carried out. Portions of the first package layer 140 and portions of the second package layer 345 are removed to form a plurality of overall package patterns 341 and consequently form a plurality of package units 350. Each of the package units 350 includes at least one light guide element 380, at least one light emitting element 110, and at least one electronic device 120.

In the embodiment, the second package layer 345 may be formed on the first package layer 140 and the light guide elements 380 after the light guide elements 380 are formed on the first package layer 140, and then the portions of the second package layer 345 and the portions of the first package layer 140 are removed at the same or different steps to form the package patterns 141. However, the invention is not limited thereto. In other embodiments, the second package layer 345 covering the package patterns 141 and the light guide elements 380 may also be formed after the package patterns 141 are formed (e.g., the steps shown in FIG. 1F or FIG. 1J) and after the light guide elements 380 are formed.

Then, the second transfer process is performed to transfer the package units 350 on the transition carrier 20 to the array substrate 160 (shown in FIG. 3B). The second transfer process of the embodiment is similar to the second transfer process shown in FIG. 1G and Step S106 in FIG. 1A. Therefore, details in this regard will not be repeated in the following.

Then, referring to FIG. 3B, the second package layer 345 (shown in FIG. 3A) and portions of the overall package patterns 341 (shown in FIG. 3A) of the package units 350 (shown in FIG. 3A) are removed, and the light guide elements 380, the light emitting elements 110, and the electronic devices 120 are exposed.

Specifically, in the embodiment, the second package layer 345 and the portions of the package patterns 141 not overlapped with the light guide elements 380 in the overall package patterns 341 may be removed, and the remaining portions of the package patterns 141 between the light guide elements 380 and the light emitting elements 110 are not removed to serve as buffer layers 342 between the light guide elements 380 and the light emitting elements 110.

The subsequent manufacturing processes are substantially the same as or similar to Step S108 in FIG. 1A and FIG. 1K. Therefore, details in this regard will not be repeated in the following.

Figure 4A:
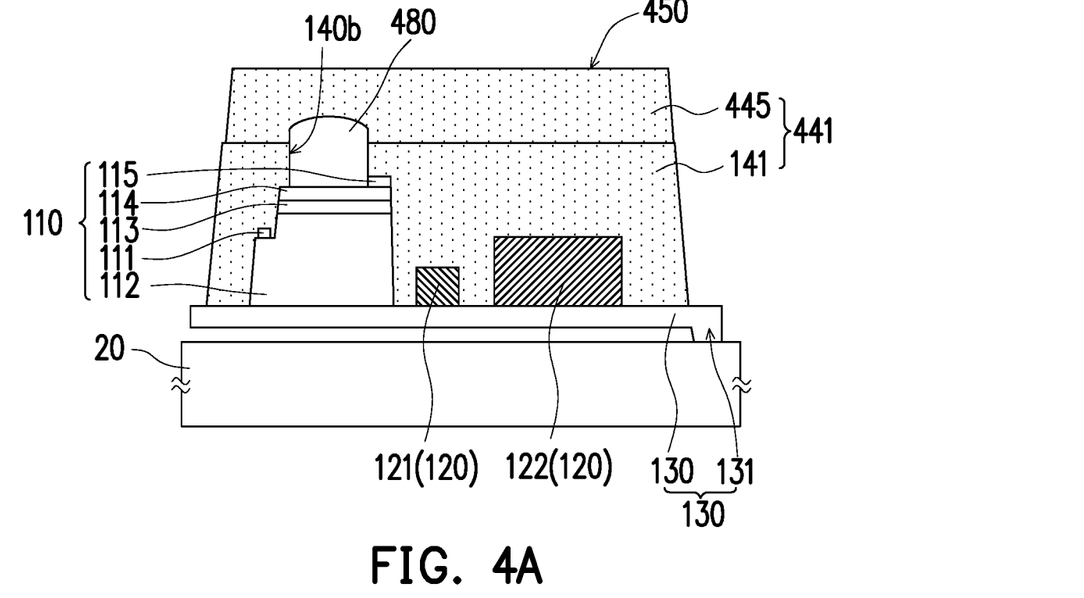
FIGS. 4A to 4B are schematic cross-sectional views illustrating a method for manufacturing a portion of a light emitting device according to a fourth embodiment of the invention.
Figure 4B:
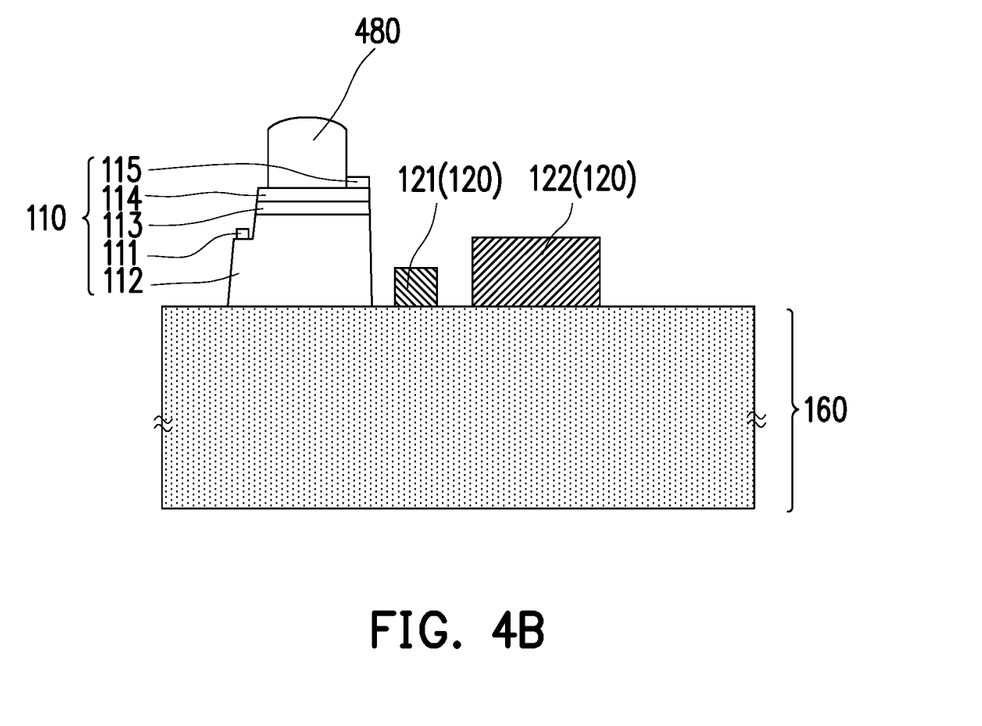

FIGS. 4A to 4B are schematic cross-sectional views illustrating a method for manufacturing a portion of a light emitting device according to a fourth embodiment of the invention. The method for manufacturing the light emitting device of the embodiment is similar to the method for manufacturing the light emitting device of the first embodiment. In addition, similar components are referred to with the same symbols and have similar functions, materials, or forming methods, and relevant descriptions will be omitted in the following. Specifically, FIGS. 4A and 4B are partial schematic top views illustrating the method for manufacturing the light emitting device after Step S104 in FIG. 1A and FIG. 1E.

Following Step S104 in FIG. 1A and FIG. 1E, in FIG. 4A, a plurality of openings 140b are formed on the first package layer 140 of the embodiment through etching, laser drilling, or mechanical drilling, and the openings 140b expose the corresponding light emitting elements 110.

Then, light guide elements 480 are formed in the openings 140b of the first package layer 140, and the material of the light guide elements 480 is different from the material of the first package layer 140.

Then, after the light guide elements 480 are formed, a second package layer 445 may be formed on the transition carrier 20 to cover the light guide elements 480 and the first package layer 140. The material and the formation method of the second package layer 445 may be similar to those of the first package layer 140. Therefore, details in this regard will not be repeated in the following.

Then, steps similar to FIGS. 1F and 1J and Step S105 in FIG. 1A may be carried out. The first package layer 140 and portions of the second package layer 445 are removed to form a plurality of overall package patterns 441 and consequently form a plurality of package units 450. Each of the package units 450 includes at least one light guide element 480, at least one light emitting element 110, and at least one electronic device 120.

In the embodiment, the second package layer 445 may be formed on the first package layer 140 and the light guide elements 480 after the light guide elements 480 are formed on the first package layer 140, and then the portions of the second package layer 445 and the portions of the first package layer 140 are removed at the same or different steps to form the overall package patterns 441. However, the invention is not limited thereto. In other embodiments, the second package layer 445 covering the package patterns 141 and the light guide elements 480 may also be formed after the package patterns 141 are formed (e.g., the steps shown in FIG. 1F or FIG. 1J) and after the light guide elements 480 are formed.

Then, the second transfer process is performed to transfer the package units 450 on the transition carrier 20 to the array substrate 160 (shown in FIG. 4B). The second transfer process of the embodiment is similar to the second transfer process shown in FIG. 1G and Step S106 in FIG. 1A. Therefore, details in this regard will not be repeated in the following.

Then, referring to FIG. 4B, the overall package patterns 441 (shown in FIG. 4A) of the package units 450 (shown in FIG. 4A) are removed, and the light guide elements 480, the light emitting elements 110, and the electronic devices 120 are exposed.

The subsequent manufacturing processes are substantially the same as or similar to Step S108 in FIG. 1A and FIG. 1K. Therefore, details in this regard will not be repeated in the following.

In view of the foregoing, in the method for manufacturing the light emitting devices according to the embodiments of the invention, the light emitting elements in a higher density are transferred from the substrate to the transition carrier. Then, the light emitting elements, other electronic devices, and/or light guide elements on the transition carrier form the package units. Afterwards, the package units in a lower density are transferred from the transition carrier to the array substrate. In this way, the precision requirement is met by using suitable machines in different transfer processes. Besides, the light emitting elements, the electronic devices and/or the light guide elements on the transition carrier are transferred to the array substrate after being integrated in the package units. Therefore, the number of times of transferring to the array substrate is reduced, and the influences caused by the size of the light emitting elements or the electronic devices is reduced. Therefore, the yield rate, the machine usage, and the production efficiency are increased, and the manufacturing cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a light emitting device, comprising:
   forming a plurality of light emitting elements on a substrate, wherein the light emitting elements are disposed on the substrate in a first density;
   performing a first transfer process to transfer the light emitting elements on the substrate to a transition carrier, wherein the light emitting elements are disposed on the transition carrier in a second density, and the first density is greater than the second density;
   disposing a plurality of electronic devices on the transition carrier, wherein the electronic devices are respectively disposed in correspondence with the light emitting elements;
   forming a first package layer on the transition carrier to cover the light emitting elements and the electronic devices;
   removing portions of the first package layer to form a plurality of package patterns and thereby form a plurality of package units, wherein each of the package units comprises at least one of the light emitting elements and at least one of the electronic devices;
   performing a second transfer process to transfer the package units on the transition carrier to an array substrate;
   removing the package patterns of the package units and exposing the light emitting elements and the electronic devices; and
   forming a plurality of connection electrodes to respectively electrically connect the respective light emitting elements to some control units on the array substrate and to respectively electrically connect the respective electronic devices to some other control units on the array substrate, wherein the light emitting element and the electronic device of each of the package units are electrically conductively insulated from each other before the step of forming the plurality of connection electrodes, the step of removing the package patterns of the package units and exposing the light emitting elements and the electronic devices, and the step of performing the second transfer process.

2. The method for manufacturing the light emitting device as claimed in claim 1, wherein the first density is greater than or equal to two-fold of the second density.

3. The method for manufacturing the light emitting device as claimed in claim 1, wherein the electronic devices comprise lighting elements, touch elements, sensing elements, driving elements, energy storage elements and/or energy conversion elements.

4. The method for manufacturing the light emitting device as claimed in claim 3, wherein the electronic devices are lighting elements, and the lighting elements and the light emitting elements are the same type but have different emission spectra.

5. The method for manufacturing the light emitting device as claimed in claim 1, wherein each of the package patterns covers the at least one light emitting element and the at least one electronic device.

6. The method for manufacturing the light emitting device as claimed in claim 5, wherein a material of the first package layer comprises a photoresist or a polymer gel material.

7. The method for manufacturing the light emitting device as claimed in claim 1, wherein a size of an area of the light emitting element is greater than or equal to 5 $\mu m^2$ and smaller than or equal to 50 $\mu m^2$.

8. The method for manufacturing the light emitting device as claimed in claim 1, wherein a size of the package unit is greater than or equal to 50 $\mu m^2$ and smaller than or equal to one million $\mu m^2$.

9. The method for manufacturing the light emitting device as claimed in claim 1, wherein in each of the package units:
   a minimum distance between a top surface of the package pattern and the light emitting element is greater than or equal to 0.2 $\mu m$, and
   a minimum distance between the top surface of the package pattern and the electronic device is greater than or equal to 0.2 $\mu m$.

10. The method for manufacturing the light emitting device as claimed in claim 1, wherein after the first package layer is formed, the method further comprises:
    forming a plurality of light guide elements on the first package layer, wherein the light guide elements respectively correspond to the respective light emitting elements; and
    forming a second package layer to cover the light guide elements and the first package layer.

11. The method for manufacturing the light emitting device as claimed in claim 10, wherein the light guide elements are a plurality of lenses.

12. The method for manufacturing the light emitting device as claimed in claim 1, wherein different types of transfer devices are used in the second transfer process and the first transfer process.

13. The method for manufacturing the light emitting device as claimed in claim 1, wherein the first transfer process comprises imprinting, electrostatic, or wafer transfer.

14. The method for manufacturing the light emitting device as claimed in claim 1, wherein the second transfer process comprises vacuum suction, mechanical picking and placing, electrostatic suction, or magnetic suction.

15. The method for manufacturing the light emitting device as claimed in claim 1, wherein each of the package patterns encapsulates multiple ones of the light emitting elements and multiple ones of the electronic devices.

16. The method for manufacturing the light emitting device as claimed in claim 1, further comprising:

forming a plurality of light guide elements on the first package layer, wherein the light guide elements are disposed in correspondence with the light emitting elements on the transition carrier; and forming a second package layer on the first package layer to encapsulate the light guide elements, wherein removing the portions of the first package layer further comprises removing portions of the second package layer to form the package patterns, so as to form the package units, wherein each of the package units comprises at least one of the light emitting elements, at least one of the electronic devices, and at least one of the light guide elements.

17. A method for manufacturing a light emitting device, comprising:

forming a plurality of first light emitting elements on a first substrate, wherein a first number of the first light emitting elements are in a unit area of the first substrate;

forming a plurality of second light emitting elements on a second substrate, wherein a second number of the second light emitting elements are in a unit area of the second substrate;

performing a first transfer process to transfer the first light emitting elements on the first substrate to a transition carrier, wherein a third number of the first light emitting elements are in a unit area of the transition carrier, and the first number is greater than the third number;

performing a second transfer process to transfer the second light emitting elements on the second substrate to the transition carrier, wherein the third number of the second light emitting elements are in the unit area of the transition carrier, the second light emitting elements are respectively disposed in correspondence with the first light emitting elements, and the second number is greater than the third number;

forming a first package layer on the transition carrier to cover the first light emitting elements and the second light emitting elements, wherein the first light emitting elements and the second light emitting elements have different emission spectra;

removing portions of the first package layer to form a plurality of package units, wherein each of the package units comprises at least one of the first light emitting elements and at least one of the second light emitting elements;

performing a third transfer process to transfer the package units on the transition carrier to an array substrate; and removing another portions of the first package layer of the package units to expose the first light emitting elements and the second light emitting elements, wherein the first light emitting elements and the second light emitting elements of each of the package units are electrically conductively insulated from each other before the step of removing another portions of the first package layer of the package units, and the step of removing portions of the first package layer to form a plurality of package units.

18. The method for manufacturing the light emitting device as claimed in claim 17, wherein a type of a transfer device used in the first transfer process and a type of a transfer device used in the second transfer process are the same, and the type of the transfer device used in the first transfer process and a type of a transfer device used in the third transfer process are different.

19. A method for manufacturing a light emitting device, comprising:

forming a plurality of light emitting elements on a substrate, wherein the light emitting elements are disposed on the substrate in a first density;

performing a first transfer process to transfer the light emitting elements on the substrate to a transition carrier, wherein the light emitting elements are disposed on the transition carrier in a second density, and the first density is greater than the second density;

disposing a plurality of electronic devices on the transition carrier, wherein the electronic devices are respectively disposed in correspondence with the light emitting elements;

forming a first package layer on the transition carrier to cover the light emitting elements and the electronic devices;

removing portions of the first package layer to form a plurality of package patterns and thereby form a plurality of package units, wherein each of the package units comprises at least one of the light emitting elements and at least one of the electronic devices;

performing a second transfer process to transfer the package units on the transition carrier to an array substrate;

removing the package patterns of the package units and exposing the light emitting elements and the electronic devices; and forming a plurality of connection electrodes to respectively electrically connect the respective light emitting elements to some control units on the array substrate and to respectively electrically connect the respective electronic devices to some other control units on the array substrate, wherein all of the light emitting elements and all of the electronic devices are electrically conductively insulated from each other before the step of forming the plurality of connection electrodes.

* * * * *